United States Patent
Mori (10) Patent No.: US 6,934,216 B2
(45) Date of Patent: Aug. 23, 2005

(54) SEMICONDUCTOR MEMORY DEVICE (75) Inventor: Katsuhiro Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/788,351

(22) Filed: Mar. 1, 2004

(65) Prior Publication Data

US 2004/0184345 A1 Sep. 23, 2004

(30) Foreign Application Priority Data

Mar. 18, 2003 (JP) ........................................ 2003-074217

(51) Int. Cl.[7] ................................................ G11C 8/00
(52) U.S. Cl. .............. 365/233; 365/189.05; 365/230.08
(58) Field of Search ............................ 365/233, 189.05, 365/194, 230.05, 230.08, 241, 233.5

(56) References Cited

U.S. PATENT DOCUMENTS 6,522,598 B2 * 2/2003 Ooishi ........................ 365/233
6,842,398 B2 * 1/2005 Johnson et al. ............. 365/233

OTHER PUBLICATIONS

Patent Abstract of Japan 11045571 A Feb. 16, 1999.
Patent Abstract of Japan 09129824 A May 16, 1997.

* cited by examiner

Primary Examiner—Van Thu Nguyen
Assistant Examiner—Hien Nguyen
(74) Attorney, Agent, or Firm—Arent Fox, PLLC.

(57) ABSTRACT

A mode set entry circuit outputs a latch timing signal at the timing at which the combination of a plurality of commands is detected. A first address latch circuit retains mode designation data for designating the operation mode in response to the latch timing signal and outputs the retained mode designation data. Next, a second address latch circuit retains the mode designation data outputted by the first address latch circuit in response to a latch timing signal indicating the end of the commands in the combination of the plural commands, and outputs the retained mode designation data.

20 Claims, 6 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2003-074217, filed on Mar. 18, 2003, the entire contents of which are incorporated herein by reference.

BACKGROUND OF THE INVENTION

1. Field of the Invention

The present invention relates to a semiconductor memory device having a plurality of operation modes.

2. Description of the Related Art

Conventionally, as a semiconductor memory device having a plurality operation modes, a SDRAM (Synchronous Dynamic Random Access Memory), for example, has been available. The operation mode in the SDRAM is set by the input of an illegal command (a command that is not a read, write, or refresh command). As the operation mode of the SDRAM, there are, for example, read latency (RL), burst length (BL), partial size (PS), and so on.

RL is an operation mode for setting the number of clocks required from the input of an address to the output of data read from a memory cell. In this mode, three kinds of the numbers of clocks can be set, for, example, 3 clocks, 4 clocks, and 5 clocks. BL is an operation mode for setting a word length at the time of the burst transfer. In this mode, three kinds of the word lengths can be set, for example, 8 words, 16 words, and a continuous. PS is an operation mode for setting the size of an area for partial refresh. The partial refresh is an operation in which, when, for example, most of memory cells of the SDRAM are not used for a certain period of time and only part of data are required to be retained, only the area retaining the data is refreshed. With this operation, the refresh areas are lessened to allow reduction in power consumption.

In an asynchronous DRAM, only an operation mode such as PS not involved in the burst transfer is set (hereinafter, referred to as mode setting) based on the combination of a plurality of legal commands. An example of the combination of the legal commands for the mode setting is such that write to the same addresses (in this case, all the addresses H) is executed continuously four times after one read, and re-read is not normally executed. Such a combination is a combination that is not normally executed. Address data (=to be mode designation data) are fetched to a mode register that stores the mode designation data for determining an operation mode, at the time of the final read. This timing is the same timing at which address data are fetched in a normal read operation.

A semiconductor memory device having, for example, the following configuration has been disclosed (for example, Japanese Patent Application Laid-open No. 11-45571). In this semiconductor memory device, an internal clock signal generating circuit has a clock width adjusting circuit for adjusting a pulse width of a first internal clock signal in response to the timing of a second internal clock signal, a first latch circuit sets the hold time, and a second latch circuit sets the setup time. In this manner, an internal window width of each command control signal is made larger than a conventional one to shorten the external setup time and the hold time. Consequently, a stable command control signal can be inputted in a high-frequency operation.

Further, a page-mode mask ROM, for example, having the following configuration has been disclosed (for example, Japanese Patent Application Laid-open No. 9-129824). In this page-mode mask ROM, a memory element includes: a Y pre-decoder that pre-decodes a Y address when receiving the control by an enable signal that is formed in response to address transition; a sensing/amplifying means for sensing/amplifying data read from the Y decoder controlled by the enable signal; a first latch means for latching an output of the sensing/amplifying means; a 2-stage latch means constituted of a switching element for transmitting data latched by the first latch means to a second latch means in response to an address transition pulse; and a control signal generating means for generating an enable signal and a latch signal in response to the address transition, thereby controlling the Y pre-decoder and the sensing/amplifying means to operate at least twice or more. With this configuration, the number of sensors/amplifiers is reduced, which realizes a downsized chip and reduced power consumption.

Here, there has been a demand for setting an operation mode based on the combination of legal commands also in the above-described SDRAM (synchronous DRAM), as in the asynchronous DRAM. However, if the synchronous DRAM is in, for example, a burst operation mode when, for example, RL is to be set based on the combination of the legal commands, RL to which the operation mode is to be switched is set in a mode register in the middle of the final read operation, so that the operation mode is changed. This gives rise to such a problem that the final read operation cannot be finished.

SUMMARY OF THE INVENTION

The present invention is made in consideration of the above-described circumstances, and an object thereof is to provide a semiconductor memory device in which, in setting an operation mode based on the combination of legal commands, the operation mode can be set after all commands are finished.

The present invention is made to solve the problem stated above, and a semiconductor memory device according to the present invention is a semiconductor memory device having a plurality of operation modes, including: a memory cell array constituted of memory cells from which and to which data is readable and writable; a command signal generating circuit configured to generate a command signal based on a plurality of kinds of control signals inputted from an external part; a timing detecting circuit configured to output a first timing signal indicating a timing at which a combination of a plurality of predetermined commands is detected, based on the command signal generated by the command signal generating circuit; a first mode designation data processing circuit configured to retain mode designation data for designating the operation mode in response to the first timing signal outputted by the timing detecting circuit and output the retained mode designation data; a second mode designation data processing circuit configured to retain the mode designation data outputted by the first mode designation data processing circuit, at a predetermined second timing after the commands in the combination of the plural commands are completed and output the retained mode designation data; and a data controlling circuit configured to control data read from the memory cell array and data write to the memory cell array according to the operation mode and the command signal.

With this configuration, in the semiconductor memory device according to the present invention, the first mode designation data processing circuit retains the mode designation data for designating the operation mode in response to the first timing signal indicating the timing at which the combination of the plural commands is detected and outputs the retained mode designation data. Next, the second mode designation data processing circuit retains the mode designation data outputted by the first mode designation data processing circuit, at the predetermined second timing after the commands are completed and outputs the retained mode designation data. In the above-described manner, when the operation mode is set based on the combination of the legal commands, it is possible to set the operation mode after all these commands are completed.

DETAILED DESCRIPTION OF THE PREFERRED EMBODIMENTS

Hereinafter, embodiments of the present invention will be explained.

First, the entire configuration of a SDRAM as a semiconductor memory device that is one embodiment of the present invention will be described using the drawing.

Figure 1:
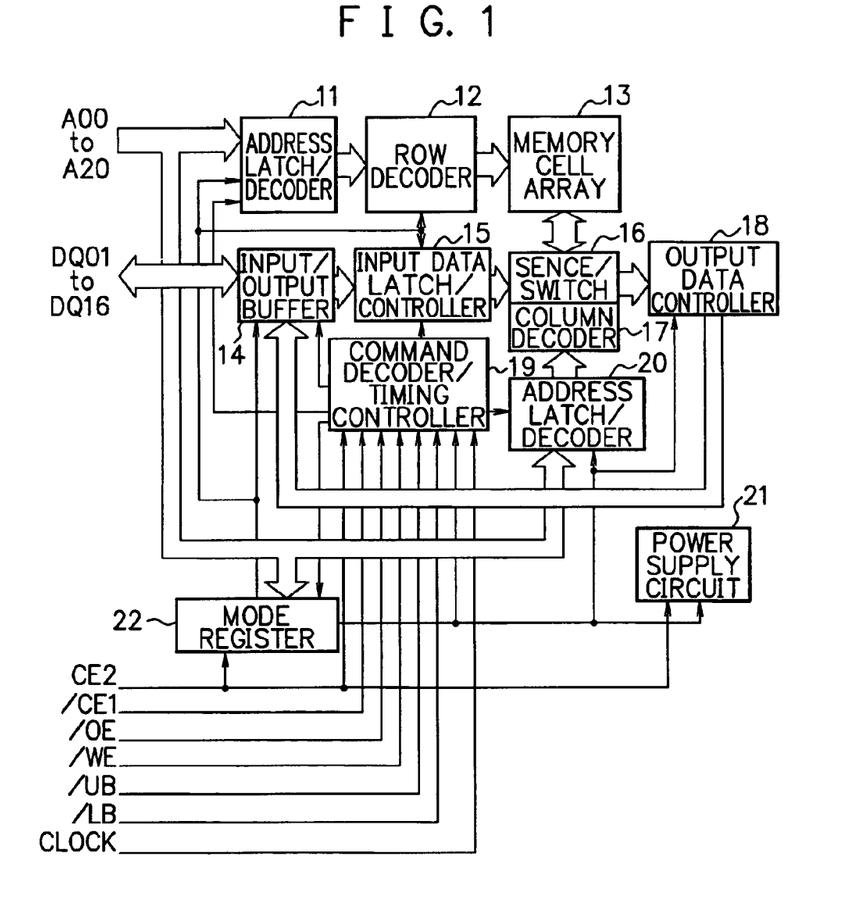
FIG. 1 is a block diagram showing the entire configuration of a SDRAM (a semiconductor memory device) according to an embodiment of the present invention.

FIG. 1 is a block diagram showing the entire configuration of the SDRAM (semiconductor memory device) according to the embodiment of the present invention. The SDRAM shown in FIG. 1 includes an address latch/decoder 11, a row decoder 12 for selecting a word line based on an output of the address latch/decoder 11, a memory cell array 13 constituted of memory cells from which and to which data is readable and writable, an input/output buffer 14 for retaining input data and output data, an input data latch/controller 15 for fetching the input data from the input/output buffer 14, a sense/switch 16 for precharging a selected bit line, a column decoder 17 for selecting the bit line based on an output of a later-described address latch/decoder 20, an output data controller 18, a command decoder/timing controller 19, an address latch/decoder 20, a power supply circuit 21, and a mode register 22. A word line and a bit line are connected to each of the memory cells of the memory cell array 13.

As shown in FIG. 1, chip enable signals /CE1, CE2, a write enable signal /WE, mask signals /LB, /UB of less significant byte data and significant byte data, and an output enable signal /OE are inputted to the command decoder/timing controller 19 of the SDRAM as external control signals. These control signals are inputted via control signal input pins /CE1, CE2, /WE, /LB, /UB, /OE provided in the SDRAM, respectively.

Further, a clock signal CLOCK to serve as a reference timing of data processing in the SDRAM is also inputted to the command decoder/timing controller 19 from a clock signal input pin CLOCK. The chip enable signal CE2 is inputted to the power supply circuit 21 to be a control signal for power supply control of the SDRAM.

Further, the SDRAM includes an address bus being a data bus for 21-bit address data A00 to A20 inputted from address input pins A00 to A20. The address bus is connected to the address latch/decoder 11, the address latch/decoder 20, and the mode register 22. The SDRAM further includes a data bus via which 16-bit data DQ01 to DQ16 are inputted and outputted, and this data bus is connected to the input/output buffer 14.

Here, the operation of the SDRAM in FIG. 1 will be briefly described.

The address latch/decoder 11 latches the address data A00 to A20 inputted to the address bus, at the control timing given from the command decoder/timing controller 19 to decode these data for the row decoder 12. The row decoder 12 further decodes a decoded value outputted from the address latch/decoder 11 and activates the word line connected the memory cell in the memory cell array 13.

The address latch/decoder 20 latches the address data A00 to A20 inputted to the address bus, at the control timing given from the command decoder/timing controller 19 to decode these data for the column decoder 17. Next, the column decoder 17 further decodes a decoded value outputted by the address latch/decoder 20 to output a column address. The sense/switch 16 activates the bit line connected to the memory cell corresponding to the column address in the memory cell array 13, based on the column address outputted by the column decoder 17. Through the above-described operation, one memory cell in the memory cell array 13 is selected (hereinafter, referred to as a selection operation).

Here, for example, when arbitrary data DQ01 to DQ16 are to be written to the memory cell array 13, the input/output buffer 14 fetches the data DQ01 to DQ16 inputted to the data bus, according to the control timing given from the command decoder/timing controller 19 to output the fetched data DQ01 to DQ16 as input data to the input data latch/controller 15. Next, the input data latch/controller 15 outputs the input data to the sense/switch 16 according to the control timing given from the command decoder/timing controller 19. Next, the sense/switch 16 executes a write process of the input data to the memory cell in the memory cell array 13. At this time, the memory cell to which the input data is to be written is the memory cell selected by the above-described selection operation.

Further, for example, when data for outputting is to be read from the memory cell array 13, the input/output buffer 14 fetches 16-bit data for outputting outputted by the output data controller 18, according to the control timing given from the command decoder/timing controller 19, and outputs the fetched data for outputting to the data bus as the data DQ01 to DQ16.

Note that in the data read operation from the memory cell array 13, the data for outputting is read by the sense/switch 16 from the memory cell that is selected by the above-described selection operation, fetched by the output data controller 18, and outputted to the input/output buffer 14 as the data for outputting.

The mode register 22 is a circuit configured to store control codes (hereinafter, referred to as mode designation data) for determining the operation mode of the SDRAM, and it controls the operation mode of the SDRAM according to the control from the command decoder/timing controller 19. The configuration of the mode register 22 and its relationship with the command decoder/timing controller 19 will be detailed later. The mode register 22 is also connected to the address latch/decoder 11, the row decoder 12, the input/output buffer 14, the input data latch/controller 15, the output data controller 18, the command decoder/timing controller 19, the address latch/decoder 20, the power supply circuit 21, and so on to control the operation mode of the SDRAM.

The SDRAM of this embodiment described above has operation modes such as read latency (RL), burst length (BL), and partial size (PS) explained in the related art. The data read/write operations in detail according to the change in the operation mode are the same as those in a typical SDRAM, and are not an essential part of this embodiment. Therefore explanation thereof will be omitted. In other words, the SDRAM of this embodiment is characterized in its operation mode setting method. The peripheral circuits (data control circuits) for reading and writing data from/to the memory cell array 13 are not limited to the configuration including the address latch/decoder 11, the row decoder 12, the input/output buffer 14, the input data latch/controller 15, the sense/switch 16, the column decoder 17, the output data controller 18, the command decoder/timing controller 19, and the address latch/decoder 20 as shown in FIG. 1. Any configuration may be adopted as long as data can be read from and written to an arbitrary address of the memory cell array 13.

Next, the configuration of the mode register 22 and its relationship with the command decoder/timing controller 19 shown in FIG. 1 will be described.

Figure 2:
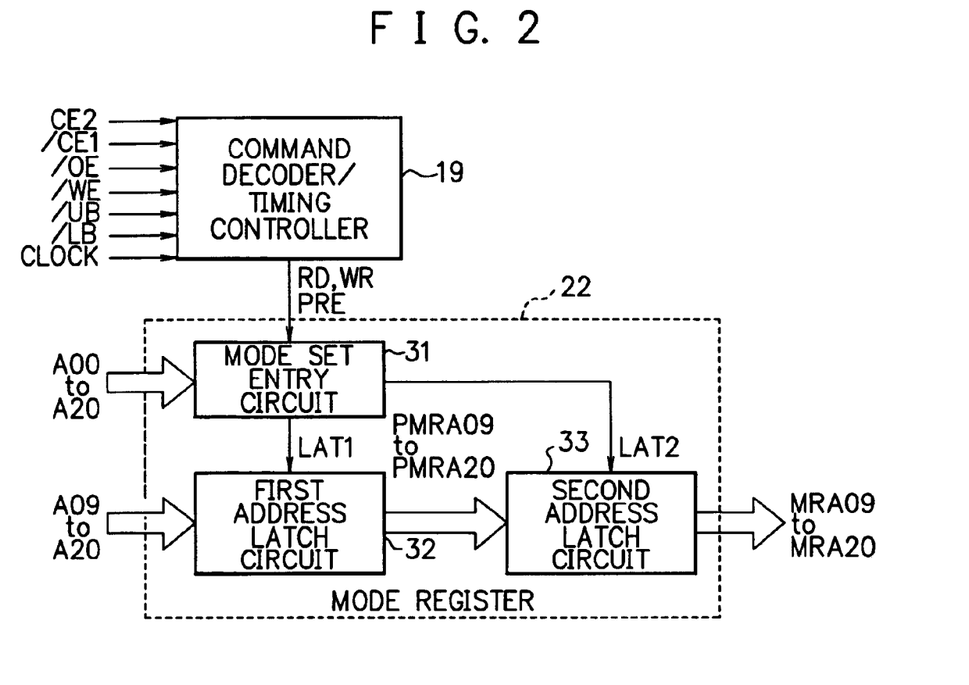
FIG. 2 is a diagram showing the configuration of a mode register 22 shown in FIG. 1 and its relationship with a command decoder/timing controller 19.

FIG. 2 is a diagram showing the configuration of the mode register 22 shown in FIG. 1 and its relationship with the command decoder/timing controller 19. The command decoder/timing controller 19 outputs a read signal RD which is a pulse signal rising in response to falling edges of the chip enable signal /CE1 and the output enable signal /OE. The command decoder/timing controller 19 also outputs a write signal WR which is a pulse signal rising in response to falling edges of the chip enable signal /CE1 and the write enable signal /WE. Therefore, the command decoder/timing controller 19 outputs the read signal RD and the write signal WR in response to the input of a read command and a write command.

The command decoder/timing controller 19 further outputs a precharge signal PRE which is a pulse signal rising in response to the end of processes based on legal commands. These read signal RD, write signal WR, and precharge signal PRE are inputted to the respective circuits in the SDRAM to be timing signals for a read operation and a write operation. As shown in FIG. 2, the read signal RD, write signal WR, and precharge signal PRE outputted by the command decoder/timing controller 19 are inputted also to the mode register 22.

The mode register 22 is constituted of a mode set entry circuit 31, a first address latch circuit 32, and a second address latch circuit 33, and based on the read signal RD, write signal WR, and precharge signal PRE outputted by the command decoder/timing controller 19, the mode register 22 latches, at a predetermined timing, the mode designation data which is inputted to the address input pins A09 to A20 at a predetermined timing and outputs the latched mode designation data. The mode set entry circuit 31 outputs a latch timing signal LAT1 and a latch timing signal LAT2 based on the address data A00 to A20, the read signal RD, the write signal WR, and the precharge signal PRE.

The first address latch circuit 32 latches the address data A09 to A20 in response to the latch timing signal LAT1 outputted by the mode set entry circuit 31 to output the latched data as pre-mode-designation data PMRA09 to PMRA20. The second address latch circuit 33 latches the pre-mode-designation data PMRA09 to PMRA20 in response to the latch timing signal LAT2 outputted by the mode set entry circuit 31 to output the latched data as mode designation data MRA09 to MRA20.

The mode set entry circuit 31 will be further described.

The mode set entry circuit 31 detects the combination of the legal commands to generate the latch timing signals for the mode designation data. Specifically, the mode set entry circuit 31 first detects from the command decoder/timing controller 19 the combination of the read signal RD according to the read command and the write signal WR according to the write command to output the latch timing signal LAT1 in response to the detection. The mode set entry circuit 31 further outputs the precharge signal PRE as it is as the latch timing signal LAT2. Here, an example of the combination of the legal commands in this embodiment is shown in the following table.

TABLE 1

| Cycle # | Command | Address (A20 to A00) |
|---------|---------|----------------------|
| 1 | Read | 1FFFFFh |
| 2 | Write | 1FFFFFh |
| 3 | Write | 1FFFFFh |
| 4 | Write | 1FFFFFh |
| 5 | Write | 1FFFFFh |
| 6 | Read | Mode designation data |

As shown in the above table, the combination of the commands are such that read from all the addresses (A00 to A20)=H (high) is first executed, next, the write to the same addresses is continuously executed four times, and reread is executed. The operation based on such a combination is not generally executed. Note that the 21-bit address data A00 to A20=H are represented as 1FFFFF in hexadecimal as shown in the table. This prevents the setting of the operation mode from being changed by a command under a normal operation. Further, as shown in the table, at the final read, namely, at the sixth cycle, address data (=to be the mode designation data) to the mode register 22 that stores the mode designation data for determining the operation mode are inputted to the address input pins A09 to A20. Note that, at this time, all the address data inputted to the address input pins A00 to A08 are H (high).

Incidentally, in this embodiment, the address input pins A09 to A20 are used for the input of the mode designation data. However, this structure is not restrictive, and the mode designation data may be inputted via arbitrary address input pins according to the number of bits of the mode designation data. Further, the final command is not limited to read but may be write or the like.

Figure 3:
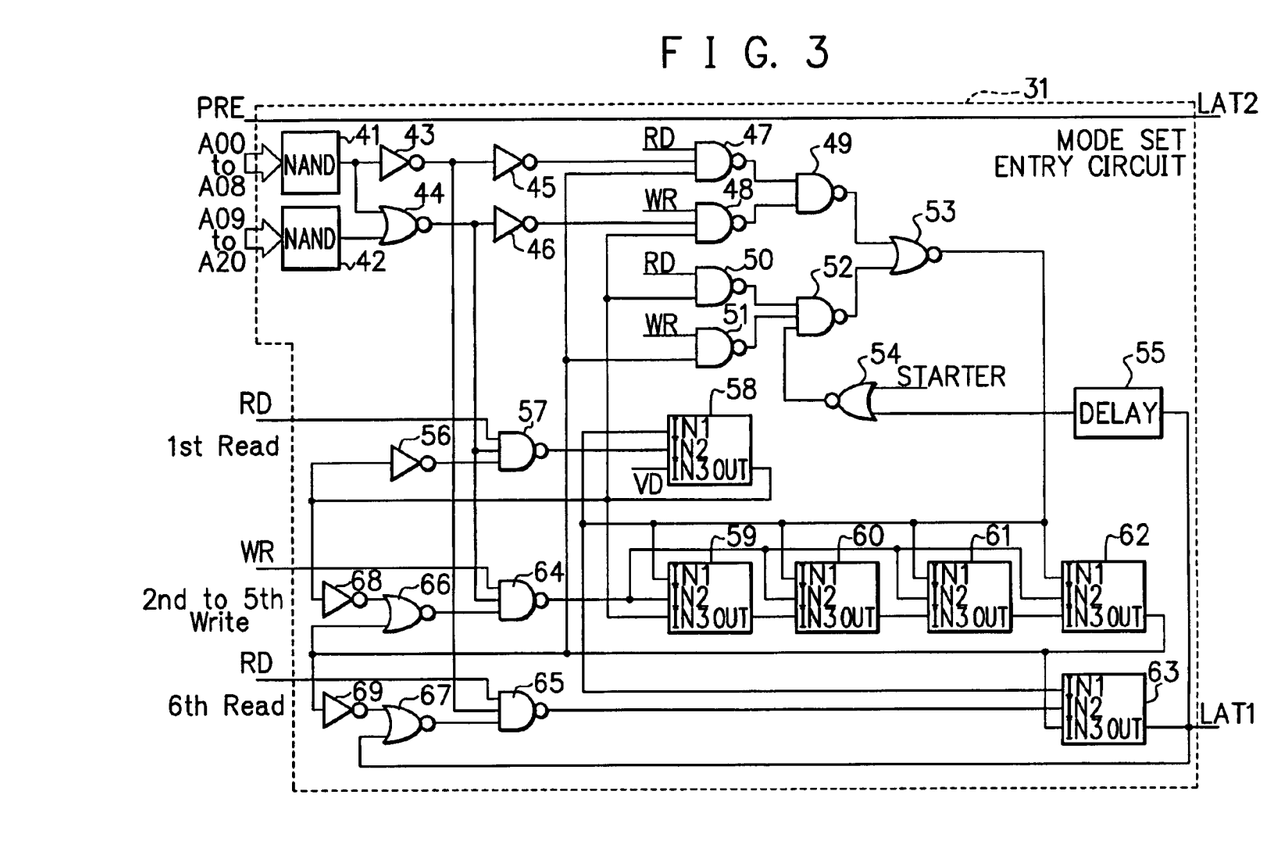
FIG. 3 is a diagram showing a circuitry example of a mode set entry circuit 31 shown in FIG. 2.

Next, a circuitry example of the mode set entry circuit 31 shown in FIG. 2 will be described with reference to the drawing.

FIG. 3 is a diagram showing a circuitry example of the mode set entry circuit 31 shown in FIG. 2. As shown in FIG. 3, the precharge signal PRE is outputted as it is as the latch timing signal LAT2. A NAND 41 is a circuit taking NAND logic of all the address data A00 to A08. Similarly, a NAND 42 is a circuit taking negative logical product of all the address data A09 to A20. Specifically, the address input pins A00 to A08 and nine input terminals of the NAND 41 are connected respectively, and the address input pins A09 to A20 are connected to twelve input terminals of the NAND 42 respectively. Further, an output terminal of the NAND 41 is connected to an input terminal of an inverter 43 and one of input terminals of a NOR (negative logical sum circuit) 44. An output terminal of the NAND 42 is connected to the other input terminal of the NOR 44.

Note that, in the following description, input terminals of each three-input element are designated as input terminals 1 to 3 for discrimination, and input terminals of each two-input element are designated as input terminals 1, 2 for discrimination. An output terminal of the inverter 43 is connected to an input terminal 2 of a NAND 47 (three inputs) via an inverter 45 and connected to an input terminal 2 of a NAND 65 (three inputs). An output terminal of the NOR 44 is connected to an input terminal 2 of a NAND 48 (three inputs) via an inverter 46, and connected to input terminals 2 of a NAND 57 (three inputs) and a NAND 64 (three inputs). Further, a signal line to which the read signal RD is inputted is connected to input terminals 1 of the NAND 47, a NAND 50, the NAND 57, and the NAND 65. A signal line to which the write signal WR is inputted is connected to input terminals 1 of the NAND 48, a NAND 51, and the NAND 64. A signal line to which a reset signal STARTER is inputted when power is supplied to the SDRAM is connected to an input terminal 1 of a NOR 54.

An output terminal of the NAND 47 and an output terminal of the NAND 48 are connected to an input terminal 1 of a NAND 49. An output terminal of the NAND 50, an output terminal of the NAND 51, and an output terminal of the NOR 54 are connected to an input terminal 1 of a NAND 52 (three inputs). An output terminal of the NAND 49 and an output terminal of the NAND 52 are connected to an input terminal 1 of a NOR 53. An output terminal of the NOR 53 is connected to input terminals IN1 of counter circuits 58 to 63. The configuration of the counter circuits 58 to 63 will be detailed later.

Further, an input terminal IN2 of the counter circuit 58 is connected to an output terminal of the NAND 57. A signal VII fixed to H (high) level is inputted to an input terminal IN3 of the counter circuit 58. An output terminal OUT of the counter circuit 58 is connected to an input terminal 3 of the NAND 48, an input terminal 2 of the NAND 50, and an input terminal IN3 of the counter circuit 59. Further, the output terminal OUT of the counter circuit 58 is connected to an input terminal 3 of the NAND 57 via an inverter 56, and connected to an input terminal 1 of a NOR 66 via an inverter 68.

An output terminal of the NOR 66 is connected to an input terminal 3 of the NAND 64. An output terminal of the NAND 64 is connected to input terminals IN2 of the counter circuits 59 to 62. An output terminal OUT of the counter circuit 59 is connected to an input terminal IN3 of the counter circuit 60. An output terminal OUT of the counter circuit 60 is connected to an input terminal IN3 of the counter circuit 61. An output terminal OUT of the counter circuit 61 is connected to an input terminal IN3 of the counter circuit 62. Further, an output terminal OUT of the counter circuit 62 is connected to an input terminal IN3 of the counter circuit 63, an input terminal 3 of the NAND 47, an input terminal 2 of the NAND 51, and an input terminal 2 of the NOR 66, and is connected to an input terminal 1 of a NOR 67 via an inverter 69.

Further, an output terminal of the NOR 67 is connected to an input terminal 3 of the NAND 65. An output terminal of the NAND 65 is connected to an input terminal IN2 of the counter circuit 63. An output terminal OUT of the counter circuit 63 is connected to an input terminal 2 of the NOR 67, connected to an input terminal 2 of the NOR 54 via a delay circuit 55, and also connected to an output terminal of the mode set entry circuit 31. Therefore, an output signal of the counter circuit 63 is the latch timing signal LAT1.

Figure 4:
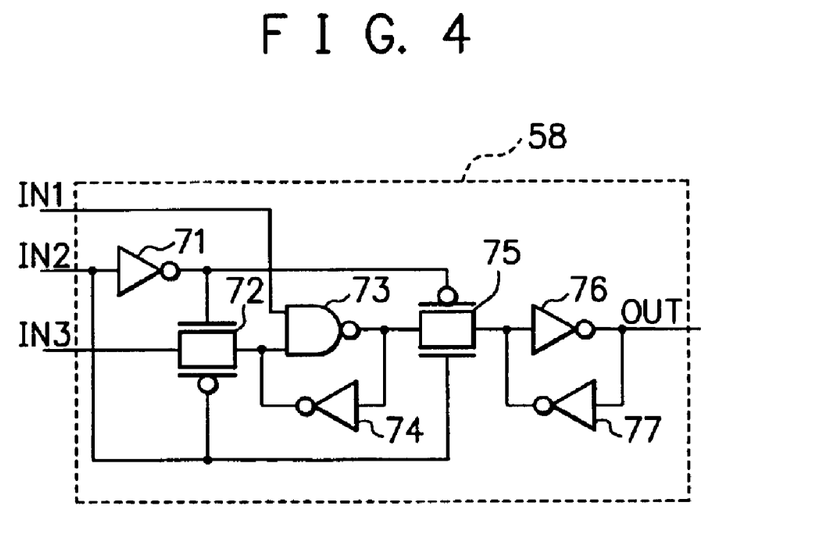
FIG. 4 is a diagram showing a circuitry example of a counter circuit 58 shown in FIG. 3.

Next, a circuitry example of the counter circuit 58 shown in FIG. 3 will be described using the drawing. The counter circuits 59 to 63 have the same circuitry as that of the counter circuit 58.

FIG. 4 is a diagram showing the circuitry example of the counter circuit 58 shown in FIG. 3. As shown in FIG. 4, the counter circuit 58 includes inverters 71, 74, 76, 77, MOS (Metal-Oxide Semiconductor) switches 72, 75, and a NAND 73. The MOS switches 72, 75 are structured such that a source terminal and a drain terminal of an n-channel MOS transistor and a source terminal and a drain terminal of a p-channel MOS transistor are connected respectively, and control signals different in polarity are inputted to gate terminals of the n-channel MOS transistor and the p-channel MOS transistor to turn on/off continuity between the source terminals and the drain terminals.

The counter circuit 58 includes the input terminals IN1 to IN3 and the output terminal OUT. Here, signals inputted to the input terminals IN1 to IN3 in this embodiment will be described. A signal that is normally fixed to H level but is changed to L (low) level at the reset time is inputted to the input terminal IN1 as a reset signal. When the reset signal is inputted to the input terminal IN1, an output from the output terminal OUT of the counter circuit 58 also turns to L (note that the input terminal IN2=H). A pulse that is normally H level and is L level for a certain period of time (hereinafter, referred to as a L pulse) is inputted to the input terminal IN2. When the output L of the output terminal OUT after the resetting is to be inverted to H according to the L pulse inputted to the input terminal IN2, H level is supplied to the input terminal IN3 before the L pulse is inputted.

The input terminal IN1 of the counter circuit 58 is connected to an input terminal 1 of the NAND 73. The input terminal IN2 is connected to an input terminal of the inverter 71, the gate terminal of the p-channel MOS transistor of the MOS switch 72, and the gate terminal of the n-channel MOS transistor of the MOS switch 75. The input terminal IN3 is connected to an input terminal of the MOS switch 72. An output terminal of the inverter 71 is connected to the gate terminal of the n-channel MOS transistor of the MOS switch 72 and the gate terminal of the p-channel MOS transistor of the MOS switch 75. An output terminal of the MOS switch 72 is connected to an input terminal 2 of the NAND 73.

An output terminal of the NAND 73 is connected to an input terminal of the MOS switch 75 and an input terminal of the inverter 74. An output terminal of the inverter 74 is connected to a mutual junction point of the output terminal of the MOS switch 72 and the input terminal 2 of the NAND 73. Note that the NAND 73 and the inverter 74 constitute a latch circuit when a H level signal is inputted from the input terminal IN1.

Further, an output terminal of the MOS switch 75 is connected to an input terminal of the inverter 76. An output terminal of the inverter 76 is connected to the output terminal OUT of the counter circuit 58 and an input terminal of the inverter 77. An output terminal of the inverter 77 is connected to a mutual junction point of the output terminal of the MOS switch 75 and the input terminal of the inverter 76. Note that the inverter 76 and the inverter 77 constitute a latch circuit.

The operation of the counter circuit 58 having the above-described configuration will be described.

For example, when a L (low) level reset signal is inputted to the input terminal IN1 of the counter circuit 58, the output of the NAND 73 turns to H. As described above, normally, the input terminal IN2 is H and therefore, the MOS switch 75 is on, so that the output H of the NAND 73 is inputted to the inverter 76 and the inverter 76 outputs L. This causes the output terminal OUT of the counter circuit 58 to output L, and the reset operation is completed. Note that at this instant, the MOS switch 72 is off and the inverter 74 is outputting L.

Next, when the L pulse is inputted to the input terminal IN2 while H level is being supplied to the input terminal IN3 in the counter circuit 58 after it is reset, the MOS switch 72 is on and the MOS switch 75 is off during a period when the input terminal IN2 is L. Consequently, H of the input terminal IN3 is inputted to the NAND 73 via the MOS switch 72 and the output of the NAND 73 turns to L (note that the input terminal IN1=H). Next, when the input terminal IN2 returns to H, the MOS switch 72 turns off and the MOS switch 75 turns on. Consequently, the output L of the NAND 73 is inputted to the inverter 76 via the MOS switch 75 and the inverter 76 outputs H. Through the above operation, in the counter circuit 58, the output is inverted to L to H when the L pulse is inputted to the input terminal IN2 while the input terminal IN3 is H after the resetting. Of course, the counter circuits 59 to 63 operate in the same manner.

Next, the operation of the mode set entry circuit 31 shown in FIG. 3 will be described based on the above-described operation of the counter circuits 58 to 63. Note that the initial values are assumed to be as follows: RD=WR=L, the address data A00 to A20=H, the reset signal STATER=L, and the latch timing signal LAT1 is also L level. At this instant, RD=WR=L, and therefore, outputs of the NANDs 47, 48, 50, 51 are H. Further, the reset signal STATER=L and the latch timing signal LAT1 is also L level, and therefore, the NOR 54 is H. Consequently, the NANDs 49, 52 are L and an output of the NOR 53 is H.

Here, in the mode set entry circuit 31, the reset signal STARTER first turns to H level for resetting. Specifically, when the reset signal STARTER changes to H, an output of the NOR 54 changes to L. Consequently, an output of the NAND 52 turns to H and the output of the NOR 53 turns to L. Through the above operation, L level signals are inputted to the input terminals IN1 of the counter circuits 58 to 63, so that the counter circuits 58 to 63 are reset. In other words, the outputs of the counter circuits 58 to 63 turn to L.

When the counter circuits 58 to 63 are thus reset, outputs of the inverters 56, 68, 69 turn to H, and outputs of the NORs 66, 67 turn to L. Since the address data A00 to A20=H, outputs of the NAND 41 and the NAND 42 are L and outputs of the inverter 43 and the NOR 44 are H. Further, outputs of the inverters 45, 46 turn to L.

Next, suppose that a pulse (pulse that is kept H for a certain period of time) of the read signal RD is inputted from the command decoder/timing controller 19 in response to the first command (read). Consequently, an output of the NAND 57 turns to L (L pulse) for a certain period of time. In other words, the L pulse is inputted to the input terminal IN2 of the counter circuit 58 after it is reset. Since a H level signal is constantly inputted to the input terminal IN3 of the counter circuit 58, the output of the counter circuit 58 is inverted to H by this L pulse. Consequently, outputs of the inverters 56, 68 turn to L, and H is inputted to the input terminal IN3 of the counter circuit 59. Further, the output of the NOR 66 turns to H. Through the above operation, the mode set entry circuit 31 detects the input of the first read command in the address data A00 to A20=H shown in the table.

Next, suppose that a pulse (pulse that is kept H for a certain period of time) of the write signal WR is inputted from the command decoder/timing controller 19 in response to the second command (write). Consequently, an output of the NAND 64 turns to L (L pulse) for a certain period of time. In other words, the L pulse is inputted to the input terminals IN2 of the counter circuits 59 to 62 after the resetting. Here, a H level signal is inputted to the input terminal IN3 of the counter circuit 59, but since L level signals are inputted to the input terminals IN3 of the counter circuits 60 to 62, only the output of the counter circuit 59 is inverted to H by this L pulse. Consequently, a H level signal is inputted to the input terminal IN3 of the counter circuit 60. Through the above operation, the mode set entry circuit 31 detects the input of the second write command in the address data A00 to A20=H.

Next, suppose that pulses (pulses that are kept H for a certain period of time) of the write signals WR are inputted from the command decoder/timing controller 19 in response to the third, fourth, and fifth commands (writes). Consequently, the outputs of the counter circuits 60, 61, 62 are inverted to H in sequence through the same operation as the above-describe operation. Consequently, a H level signal is inputted to the input terminal IN3 of the counter circuit 63. Further, an output of the inverter 69 turns to L and the output of the NOR 67 turns to H. Through the above operation, the mode set entry circuit 31 detects the input of the third to fifth write commands in the address data A00 to A20=H shown in the table.

Next, suppose that a pulse (pulse that is kept H for a certain period of time) of the read signal RD is inputted from the command decoder/timing controller 19 in response to the sixth command (read). Consequently, an output of the NAND 65 turns to L (L pulse) for a certain period of time (at this time, it is only necessary that the address data A00 to A08 are H). In other words, the L pulse is inputted to the input terminal IN2 of the counter circuit 63 after it is reset. Consequently, the output of the counter circuit 63 is inverted to H through the same operation as the above-described operation. The signal rising to H is inputted to the NOR 54 after being delayed by a predetermined time in the delay circuit 55. Accordingly, the output of the NOR 54 turns to L, the output of the NAND 52 turns to H, and the output of the NOR 53 turns to L. In other words, the counter circuits 53 to 63 are reset.

Through the above operation, the mode set entry circuit 31 outputs the latch timing signal LAT1 that is kept H only for a certain period of time. Consequently, the mode set entry circuit 31 detects the input of the sixth read command in the address data A00 to A08=H shown in the table.

As described hitherto, the mode set entry circuit 31 is capable of detecting the combination of the legal commands to output the latch timing signal LAT1 in synchronization with the final command. Incidentally, if the combination of the commands used for setting the operation mode is different from that used in this embodiment, the configuration of the mode set entry circuit 31 shown in FIG. 3 also has to be changed accordingly.

Figure 5:
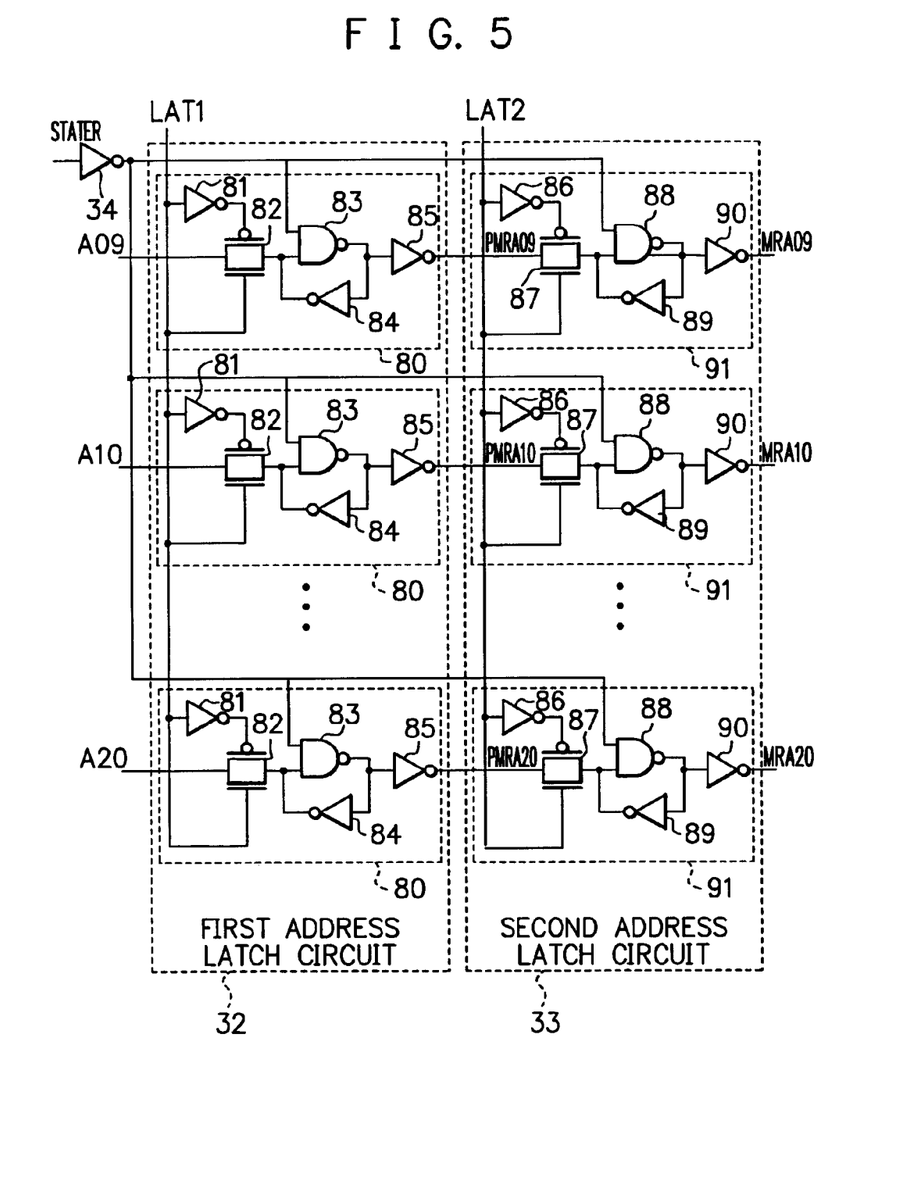
FIG. 5 is a diagram showing a circuitry example of a first address latch circuit 32 and a second address latch circuit 33 shown in FIG. 2.

Next, a circuitry example of the first address latch circuit 32 and the second address latch circuit 33 shown in FIG. 2 will be described with reference to the drawing.

FIG. 5 is a diagram showing the circuitry example of the first address latch circuit 32 and the second address latch circuit 33 shown in FIG. 2. First, the first address latch circuit 32 will be described. As shown in FIG. 5, the first address latch circuit 32 is constituted of latch circuits 80 that latch the address data A09 to A20 respectively. Each of the latch circuits 80 is constituted of inverters 81, 84, 85, an MOS switch 82, and a NAND 83.

Here, the configuration of the latch circuit 80 that latches the address data A09 will be described. The latch circuits 80 that latch the other address data A10 to A20 also have the same configuration. A signal line to which the latch timing signal LAT1 is inputted is connected to a gate terminal of an n-channel MOS transistor of the MOS switch 82 and connected via the inverter 81 to a gate terminal of a p-channel MOS transistor of the MOS switch 82. Further, a signal line to which the address data A09 is inputted is connected to an input terminal of the MOS switch 82.

A signal line to which the reset signal STARTER is inputted is connected to an input terminal 1 of the NAND 83 via an inverter 34. Further, an output terminal of the MOS switch 82 is connected to an input terminal 2 of the NAND 83. An output terminal of the NAND 83 is connected to an output terminal of the latch circuit 80 via the inverter 85 and to the input terminal 2 of the NAND 83 via the inverter 84.

With the above-described configuration, an output of the inverter 34 turns to L, an output of the NAND 83 turns to H, and an output of the inverter 85 turns to L when the reset signal STARTER turns to H, so that an output of the latch circuit 80 is reset to L. Further, since the latch timing signal LAT1 is normally L, the MOS switch 82 is off. However, when the mode set entry circuit 31 outputs the latch timing signal LAT1 that is kept at H level only for a certain period of time, the MOS switch 82 turns on, so that the address data A09 is retained in a latch constituted of the NAND 83 and the inverter 84. The retained address data A09 is inverted in the NAND 83, but further inverted in the inverter 85 to be outputted in the original state. The same applies to the other address data A10 to A20. Through the above operation, the output data PMRA09 to PMRA20 of the respective latch circuits 80 according to the address data A09 to A20 are obtained.

Next, the configuration of the second address latch circuit 33 will be described. As shown in FIG. 5, the second address latch circuit 33 is constituted of latch circuits 91 that latch the output data PMRA09 to PMRA20 of the first address latch circuit 32 respectively. Each of the latch circuits 91 is constituted of inverters 86, 89, 90, a MOS switch 87, and a NAND 88. The latch circuit 91 and the latch circuit 80 have the same configuration as is seen from FIG. 5, and the inverters 86, 89, 90, the MOS switch 87, and the NAND 88 of the latch circuit 91 correspond to the inverters 81, 84, 85, the MOS switch 82, and the NAND 83 of the latch circuit 80. Therefore, since the operation of the latch circuit 90 is the same as that of the latch circuit 80, detailed explanation thereof will be omitted. Note that outputs of the latch circuit 90 are MRA09 to MRA20.

Next, the operation of setting the operation mode in the semiconductor memory device shown in FIG. 1 to FIG. 5 will be described.

Figure 6:
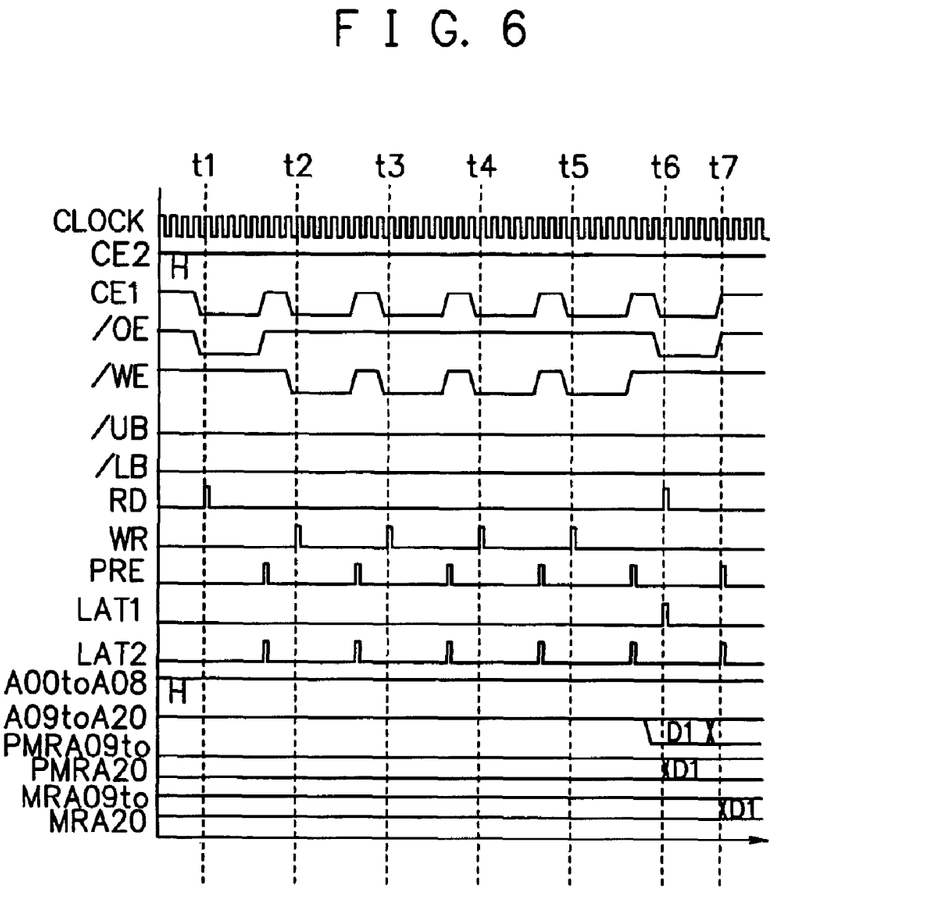
FIG. 6 is a waveform chart showing the operation of setting an operation mode in the semiconductor memory device shown in FIG. 1 to FIG. 5.

FIG. 6 is a waveform chart showing the operation of setting the operation mode in the semiconductor memory device shown in FIG. 1 to FIG. 5. As shown in FIG. 6, the clock signal CLOCK is inputted to the clock signal input pin CLOCK of the SDRAM in FIG. 1. The chip enable signal CE2 inputted to the control signal input pin CE2 and the address data A00 to A20 inputted to the address input pins A00 to A20 are fixed to H. Further, the mask signals /UB, /LB of significant data and less significant data inputted to the control signal pins /UB, /LB are fixed to L. The reset operations of the respective circuits in the SDRAM are assumed to have been completed. Note that the initial values of the chip enable signal /CE1, the write enable signal /WE, and the output enable signal /OE inputted to the control signal pins /CE1, /OE, /WE are all set to H.

Next, when the chip enable signal /CE1 and the output enable signal /OE fall at a time t1, it signifies that the read being the first command for setting the operation mode is inputted to the SDRAM. In response thereto, the command decoder/timing controller 19 outputs the read signal RD which is a pulse signal. Based on this output, the input of the read that is the first command in the address data A00 to A20=H is detected in the mode set entry circuit 31 of the mode register 22. Note that the chip enable signal /CE1 and the output enable signal /OE that fell at the time t1 rise after a certain period of time.

Next, when the chip enable signal /CE1 and the write enable signal /WE fall at a time t2, it signifies that the write that is the second command for setting the operation mode is inputted to the SDRAM. In response thereto, the command decoder/timing controller 19 outputs the write signal WR which is a pulse signal. Based on this output, the input of the write being the second command in the address data A00 to A20=H is detected in the mode set entry circuit 31 of the mode register 22. Note that the chip enable signal /CE1 and the write enable signal /WE that fell at the time t2 rise after a certain period of time.

Next, when the chip enable signal /CE1 and the write enable signal /WE fall at times t3, t4, t5, it signifies, as is signified at the time t2, that the writes being the third, fourth, and fifth commands for setting the operation modes are inputted to the SDRAM. In response thereto, the command decoder/timing controller 19 outputs the write signal WR which is a pulse signal three times. Based on this output, the input of the writes that are the third, fourth, fifth commands in the address data A00 to A20 is detected in the mode set entry circuit 31 of the mode register 22. Note that the chip enable signal /CE1 and the write enable signal /WE that fell at the times t3, t4, t5 rise after a certain period of time.

Next, when the chip enable signal /CE1 and the output enable signal /OE fall at a time t6, it signifies that the read being the sixth command for setting the operation mode is inputted to the SDRAM. In response thereto, the command decoder/timing controller 19 outputs the read signal RD which is a pulse signal. Based on this output, the mode set entry circuit 31 of the mode register 22 detects the input of the read being the sixth command in the address data A00 to A08=H to output the latch timing signal LAT1 which is a pulse signal.

Consequently, the first address latch circuit 32 latches the address data A09 to A20=D1 (mode designation data) inputted to the address input pins A09 to A20, in synchronization with a rising edge of the latch timing signal LAT1 and outputs the output data PMRA09 to PMRA20. Note that the chip enable signal /CE1 and the output enable signal /OE that fell at the time t6 rise after a certain period of time. Further, it is assumed that the address data A09 to A20=D1 (mode designation data) are inputted to the address input pins A09 to A20 at an arbitrary timing during the period from the end of the fifth command to the time t6.

Next, when the latch timing signal LAT2 rises in response to a rising edge of the precharge signal PRE at a time t7, the second address latch circuit 33 latches the output data PMRA09 to PMRA20=D1 outputted by the first address latch circuit 32, in synchronization with a rising edge of the latch timing signal LAT2 and outputs the output data MRA09 to MRA20=D1. The output data MRA09 to MRA20=D1 are supplied to the respective circuits of the SDRAM as the mode designation data, so that the operation mode is set. Note that the precharge signal PRE is a signal that rises in synchronization with the end of the commands.

As described hitherto, in the SDRAM of this embodiment, when the setting of the operation mode is changed based on the combination of the legal commands, it is possible to change the setting of the operation mode at an end timing of the final command instead of at an execution timing of the final command in the combination of the commands. Further, the timing for changing the setting of the operation mode is not limited to the end timing of the final command in the combination of the commands as described above, but may be an end timing of a command in an arbitrary order in the combination of the commands. Consequently, when a series of operations such as the bust operation having a plurality of cycles continues according to the commands, the operation mode is prevented from being changed in the middle of the operations.

In the above-described embodiment, the synchronous DRAM (SDRAM) is taken as an example, but the present invention is not limited to this. The present invention may be applied to a semiconductor memory device that can be switched over between a synchronous type and an asynchronous type by an external command setting.

As is described hitherto, in the semiconductor memory device according to the present invention, the first mode designation data processing circuit retains the mode designation data for designating the operation mode in response to the first timing signal that indicates the timing at which the combination of the plural commands is detected, and outputs the retained mode designation data. Next, the second mode designation data processing circuit retains the mode designation data outputted by the first mode designation data processing circuit at the predetermined second timing after the end of the commands in the combination of the plural commands, and outputs the retained mode designation data. Consequently, when the operation mode is set based on the combination of legal commands, the operation mode can be set after all the commands are finished.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor memory device having a plurality of operation modes, comprising:
   a memory cell array constituted of memory cells from which and to which data is readable and writable;
   a command signal generating circuit configured to generate a command signal based on a plurality of kinds of control signals inputted from an external part;
   a timing detecting circuit configured to output a first timing signal indicating a timing at which a combination of a plurality of commands is detected, based on the command signal generated by said command signal generating circuit;
   a first mode designation data processing circuit configured to retain mode designation data for designating the operation mode in response to the first timing signal outputted by said timing detecting circuit, and output the retained mode designation data;
   a second mode designation data processing circuit configured to retain the mode designation data outputted by said first mode designation data processing circuit, at a second timing after the commands in the combination of the plural commands are completed, and output the retained mode designation data; and
   a data controlling circuit configured to control data read from said memory cell array and data write to said memory cell array according to the operation mode and the command signal.

2. The semiconductor memory device according to claim 1,
   wherein the mode designation data is inputted utilizing part or all of plural-bit address data, and
   wherein said first mode designation data processing circuit retains part or all of values of the address data in response to the first timing signal and outputs the retained values as the mode designation data.

3. The semiconductor memory device according to claim 1, further comprising
   a timing controlling circuit configured to output an end timing signal that changes at a timing at which processes according to the commands are finished,
   wherein said second mode designation data processing circuit retains the mode designation data outputted by said first mode designation data processing circuit at the second timing and outputs the retained mode designation data, the second timing being defined as the change of the end timing signal outputted by said timing controlling circuit.

4. The semiconductor memory device according to claim 1, wherein the operation mode includes at least an operation mode in which a series of processes are executed for a plurality of addresses based on one command.

5. The semiconductor memory device according to claim 4, wherein the series of processes executed for the plural addresses based on the one command is a burst operation.

6. The semiconductor memory device according to claim 1, wherein kind of the operation mode includes at least one of read latency, burst length, and partial size.

7. The semiconductor memory device according to claim 1, wherein said semiconductor memory device operates asynchronously.

8. The semiconductor memory device according to claim 1,
   wherein an asynchronous operation and a synchronous operation are switchable in said semiconductor memory device, and
   wherein the asynchronous operation and the synchronous operation are switched according to designation of the operation mode based on the combination of the commands.

9. The semiconductor memory device according to claim 1, wherein the command signal used by said timing detecting circuit for the detection is a command signal instructing data read from the said memory cell array or data write to said memory cell array.

10. The semiconductor memory device according to claim 1, wherein said timing detecting circuit uses a value of address data inputted according to the command signal, for detecting the combination of the commands.

11. The semiconductor memory device according to claim 9, wherein a sequence of the commands in the combination and a value of address data inputted according to the commands are a sequence of commands in a combination and a value of address data that are not possible in a normal operation.

12. The semiconductor memory device according to claim 1, wherein the operation mode is set at an instant at which said second mode designation data processing circuit outputs the mode designation data.

13. The semiconductor memory device according to claim 1, wherein a bit line and a word line is connected to each of the memory cells in said memory cell array, and wherein said data controlling circuit activates the bit line and the word line specified according to address data to specify the memory cell and controls data read from said memory cell array and data write to said memory cell array.

14. The semiconductor memory device according to claim 12, wherein said data controlling circuit operates according to the operation mode based on the mode designation data outputted by said second mode designation data processing circuit.

15. An operation mode setting method in a semiconductor memory device having a plurality of operation modes, comprising:

a first step of generating a command signal based on a plurality of kinds of control signals inputted from an external part;

a second step of outputting a first timing signal indicating a timing at which a combination of a plurality of commands is detected, based on the command signal outputted in said first step;

a third step of retaining mode designation data for designating the operation mode in response to the first timing signal outputted in said second step and outputting the retained mode designation data;

a fourth step of retaining the mode designation data outputted in said third step, at a second timing after an end of the commands in the combination of the plural commands and outputting the retained mode designation data, to thereby set the operation mode.

16. The operation mode setting method according to claim 15, wherein said semiconductor memory device has a memory cell array constituted of memory cells from which and to which data is readable and writable, the method further comprising a fifth step of controlling data read from the memory cell array and data write to the memory cell array according to the operation mode and the command signal generated in said first step.

17. The operation mode setting method according to claim 15, wherein the mode designation data is inputted utilizing part or all of plural-bit address data, and wherein part or all of values of the address data is retained in response to the first timing signal and the retained values are outputted as the mode designation data in said third step.

18. The operation mode setting method according to claim 15, wherein said fourth step comprises generating an end timing signal that changes at a timing at which processes according to the commands finish, and wherein the mode designation data inputted in said third step is retained at the second timing and outputted, the second timing being defined as the change of the end timing signal.

19. The operation mode setting method according to claim 15, wherein the operation mode includes at least an operation mode in which a series of processes are executed for a plurality of addresses based on one command.

20. The operation mode setting method according to claim 15, wherein kind of the operation mode include at least one of read latency, burst length, and partial size.

* * * * *